US009953986B2

United States Patent
Wang

(10) Patent No.: US 9,953,986 B2
(45) Date of Patent: Apr. 24, 2018

(54) METHOD AND APPARATUS FOR IMPROVING READ MARGIN FOR AN SRAM BIT-CELL

(71) Applicant: INTEL CORPORATION, Santa Clara, CA (US)

(72) Inventor: Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 45 days.

(21) Appl. No.: 14/137,879

(22) Filed: Dec. 20, 2013

(65) Prior Publication Data

US 2015/0179653 A1    Jun. 25, 2015

(51) Int. Cl.
*H01L 21/70* (2006.01)
*H01L 27/11* (2006.01)
*G11C 11/419* (2006.01)

(52) U.S. Cl.
CPC ........ *H01L 27/1104* (2013.01); *G11C 11/419* (2013.01)

(58) Field of Classification Search
CPC ......... G11C 14/00; G11C 7/20; G11C 11/419; H01L 27/1104
USPC ....................................................... 257/369
See application file for complete search history.

(56) References Cited

U.S. PATENT DOCUMENTS

| | | | |
|---|---|---|---|
| 5,051,951 A * | 9/1991 | Maly ........................ | G11C 7/20 257/316 |
| 5,700,711 A * | 12/1997 | Hsu ..................... | H01L 27/1112 148/DIG. 136 |
| 7,177,176 B2 | 2/2007 | Zheng et al. | |
| 8,451,670 B2 | 5/2013 | Kolar et al. | |
| 8,519,462 B2 | 8/2013 | Wang et al. | |
| 9,013,941 B2 | 4/2015 | Swaroop et al. | |
| 9,041,146 B2 | 5/2015 | Kevin et al. | |
| 2003/0122159 A1 * | 7/2003 | Ikeda .................. | G11C 11/4125 257/204 |
| 2006/0022242 A1 * | 2/2006 | Sugatani ........... | H01L 21/76229 257/296 |

(Continued)

FOREIGN PATENT DOCUMENTS

WO    WO-2013/147728    10/2013
WO    WO-2013/147848    10/2013

(Continued)

*Primary Examiner* — Stephen Bradley
*Assistant Examiner* — Patricia Reddington
(74) *Attorney, Agent, or Firm* — Schwabe, Williamson & Wyatt, P.C.

(57) ABSTRACT

Described is a 6T SRAM cell which comprises: a first n-type transistor with a gate terminal coupled to word-line, source/drain terminal coupled to a first bit-line and drain/source terminal coupled to a first node; and a second n-type transistor with a source terminal coupled to a first supply node, a drain terminal coupled to the first node, and a gate terminal for coupling to multiple terminals, wherein the gate terminal includes a capacitor to increase coupling capacitance of the second n-type transistor. Described is a method which comprises: forming a metal gate in a first direction; forming a first spacer in the first direction on one side of the metal gate, the first spacer having a first dimension; and forming a second spacer in the first direction on another side of the metal gate, the second spacer having a second dimension which is substantially different from the first dimension.

7 Claims, 8 Drawing Sheets

(56) References Cited

U.S. PATENT DOCUMENTS

| | | | |
|---|---|---|---|
| 2006/0084247 A1* | 4/2006 | Liu | H01L 21/28097 438/510 |
| 2007/0153610 A1 | 7/2007 | Hamzaoglu et al. | |
| 2008/0157225 A1 | 7/2008 | Datta et al. | |
| 2014/0003181 A1* | 1/2014 | Wang | G11C 11/413 365/226 |
| 2014/0264668 A1 | 9/2014 | Lee et al. | |
| 2014/0340957 A1 | 11/2014 | Wang et al. | |
| 2015/0206564 A1 | 7/2015 | Raychowdhury et al. | |

FOREIGN PATENT DOCUMENTS

| | | |
|---|---|---|
| WO | WO-2014/142956 | 9/2014 |
| WO | WO-2014/142978 | 9/2014 |
| WO | WO-2014/209392 | 12/2014 |

* cited by examiner

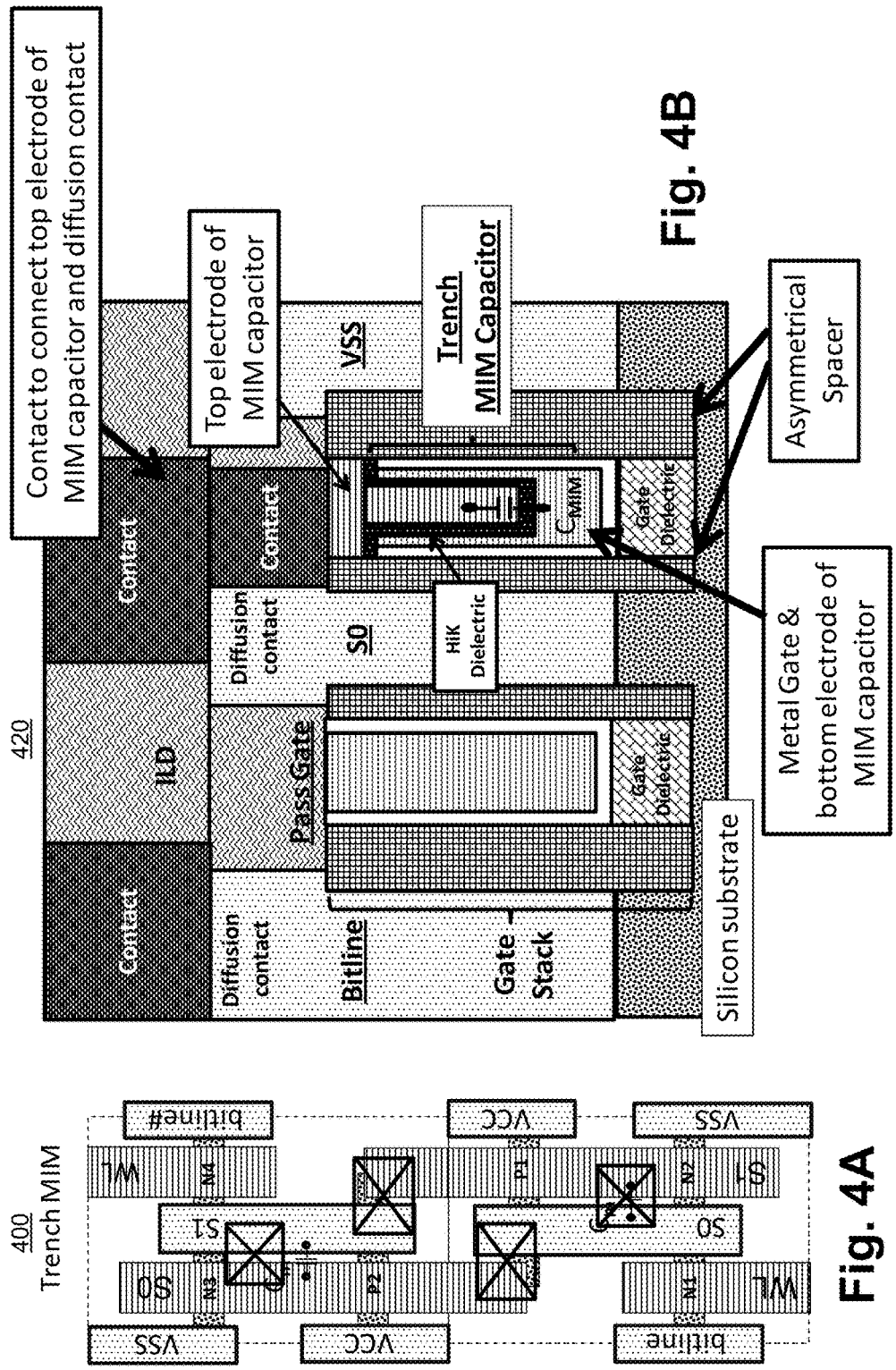

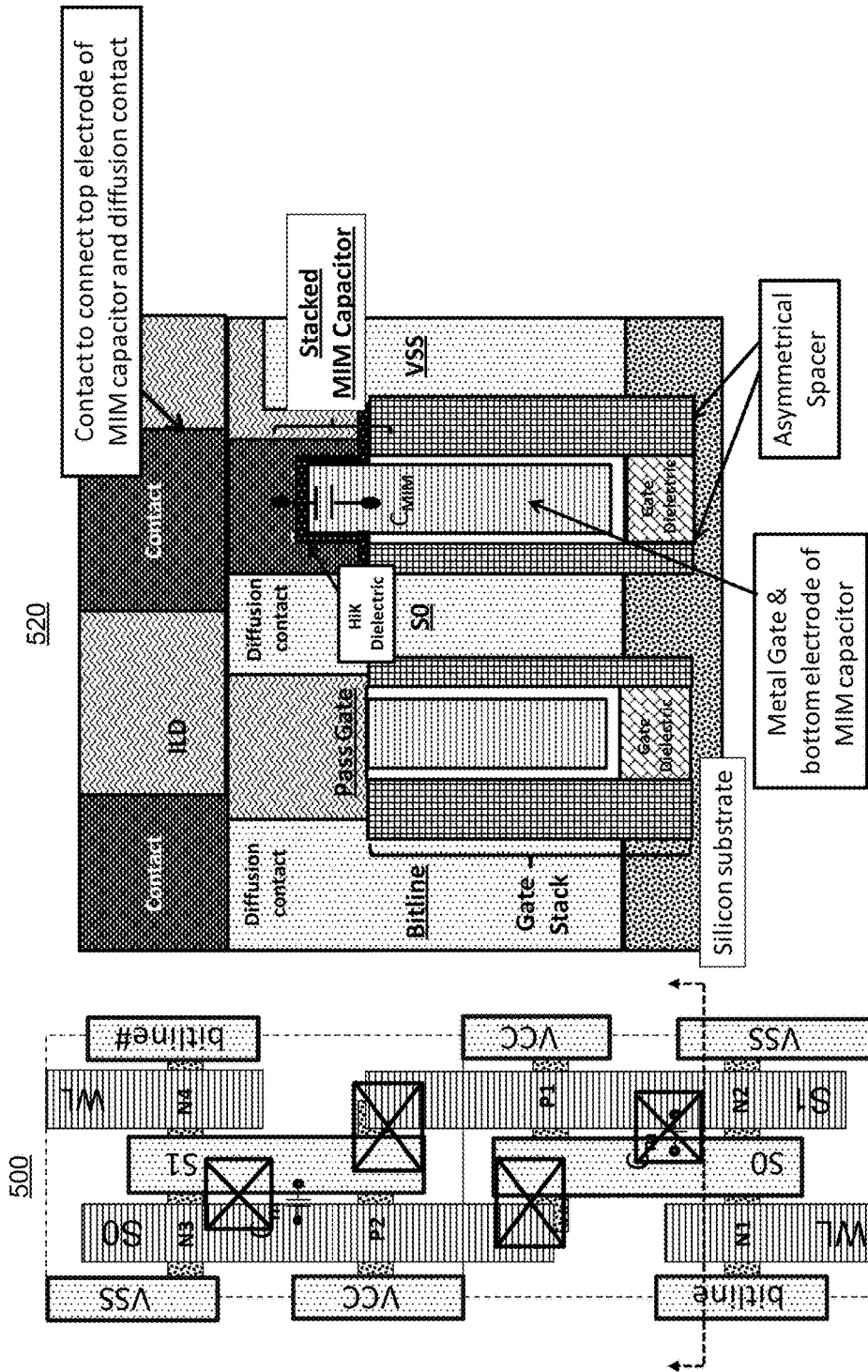

METHOD AND APPARATUS FOR IMPROVING READ MARGIN FOR AN SRAM BIT-CELL

BACKGROUND

Area scaling of SRAM (Static Random Access Memory) bit-cell is limited by read stability of an SRAM bit-cell. The conventional method to address SRAM read margin issue is to apply circuit assist technique by under driving word-line (WL). In this technique, WL voltage is lowered which makes the pull-down transistors of the SRAM bit-cell stronger than the access transistors (i.e., pass-gates). The write assist circuit allows the SRAM bit-cell to operate at a lower supply voltage while improving read margin. Lowering WL voltage, however, reduces bit-cell read current and degrades the performance of the SRAM bit-cell during low-voltage operation. For example, as WL voltage is lowered, the access transistors exhibit higher resistance which translates to lower SRAM performance. The circuit assist technique limits the SRAM design space for a designer because the designer is limited to trading off performance of the SRAM bit-cell for higher SRAM density or vice versa.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4A illustrates an SRAM bit-cell layout with enhanced coupling capacitance including an embedded MIM (Metal-Insulator-Metal) capacitor between storage nodes, according to one embodiment of the disclosure.

FIG. 4B illustrates a cross-section view of the SRAM bit-cell of FIG. 4A, according to one embodiment of the disclosure.

FIG. 5A illustrates an SRAM bit-cell layout with enhanced coupling capacitance including a grown MIM capacitor between storage nodes, according to one embodiment of the disclosure.

FIG. 5B illustrates a cross-section view of the SRAM bit-cell of FIG. 5A, according to one embodiment of the disclosure.

DETAILED DESCRIPTION

Figure 1:
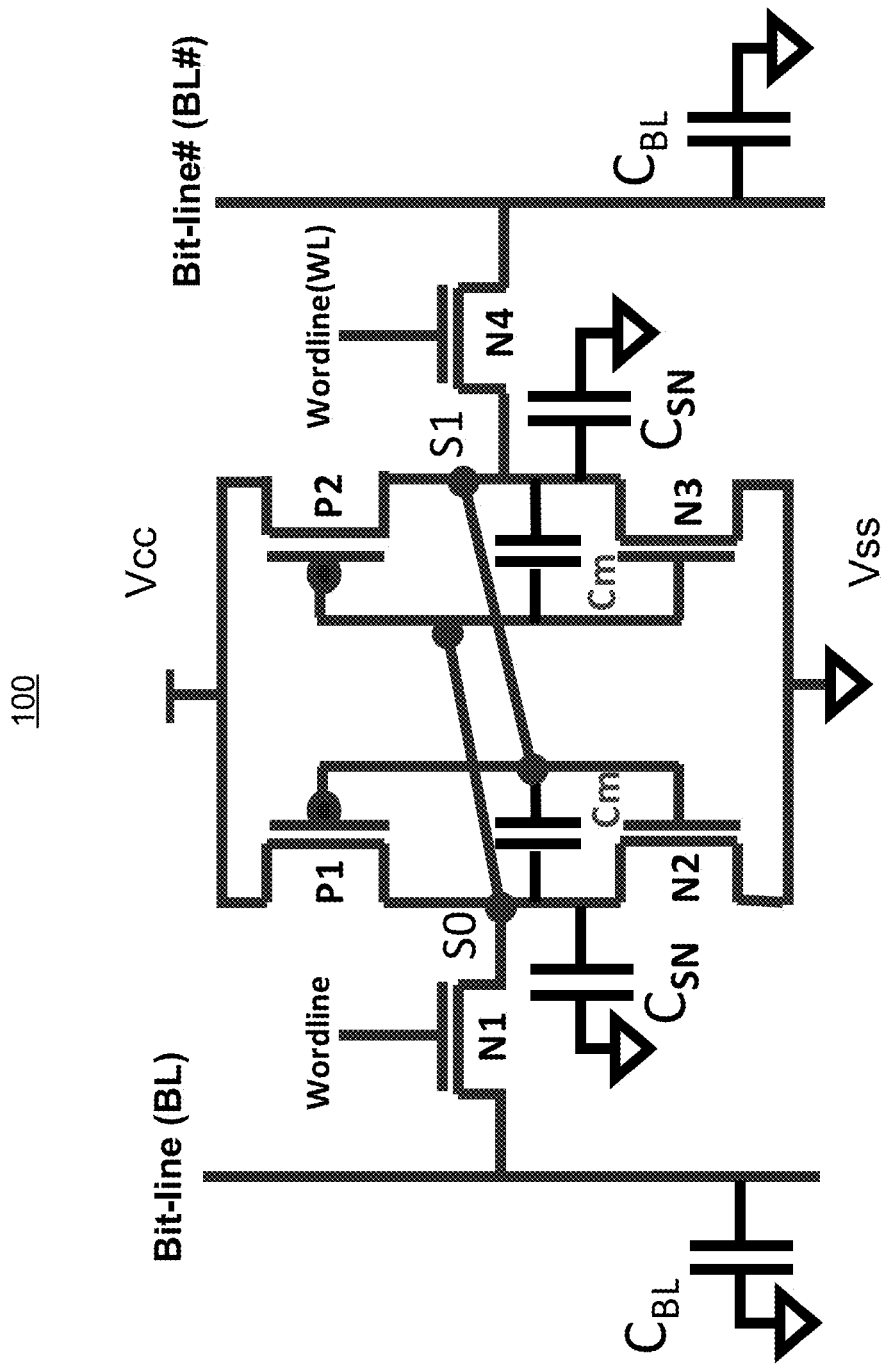
FIG. 1 illustrates an SRAM bit-cell with coupling capacitance between storage nodes, according to one embodiment of the disclosure.

The embodiments increase capacitance of storage nodes of an SRAM bit-cell to improve read noise margin. In one embodiment, read disturbance noise is suppressed with higher storage node capacitance. In one embodiment, higher storage node capacitance is achieved by one or more circuit/layout and process techniques. In one embodiment, spacers between gate terminals of the pull-down devices and the diffusion regions of the storage nodes are formed from a High-K material. Examples of High-K material include: oxynitride or hafnium-based high-k dielectrics. In one embodiment, spacers between gate terminals of the pull-down devices and the diffusion contact regions of the storage nodes are made asymmetric to increase capacitance for the storage nodes. In one embodiment, spacers between gate terminals of the pull-down devices and the diffusion contact regions of the storage nodes are formed from High-K material and are also made asymmetric.

In one embodiment, a three-dimensional (3D) MIM (Metal-Insulator-Metal) capacitor is stacked on top or trenched within the gate terminal stack for the pull-down devices. In one embodiment, spacers between gate terminals of the pull-down devices and diffusion contact regions of the storage nodes are formed from High-K material and are also made asymmetric, in addition to using the 3D MIM capacitor. In one embodiment, bit-line (BL) capacitance $C_{BL}$ is reduced relative to storage node capacitance by using Low-K material to form the spacer between the pass-gate transistor gate terminal and the BL. Examples of Low-K material include Carbon-doped silicon dioxide or porous silicon dioxide. In one embodiment, $C_{BL}$ is reduced relative to storage node capacitance by using Low-K material to form the spacer between the pass-gate transistor gate terminal and the BL, and using asymmetric spacers for pass-gate gate terminals.

One of many technical effects of the embodiments is increase (i.e., improvement) in read noise margin without sacrificing the read performance of SRAM bit-cell. The embodiments enable high speed operation for the minimal-area SRAM bit-cell. Other technical effects will be evident from the embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and the include plural references. The meaning of in includes in and "on."

The term "scaling" generally refers to converting a design (schematic and layout) from one process technology to another process technology. The term "scaling" generally also refers to downsizing layout and devices within the same technology node. The terms "substantially," "close," "approximately," "near," "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates a n-type transistor (e.g., NMOS, NPN BJT, etc.) and the term "MP" indicates a p-type transistor (e.g., PMOS, PNP BJT, etc.).

FIG. 1 illustrates an SRAM bit-cell 100 with coupling capacitance between storage nodes, according to one embodiment of the disclosure. In this embodiment, a 6T (six-transistor) SRAM bit-cell is shown with enhanced storage node capacitors $C_m$. A 6T bit-cell is well known so its circuit is briefly described. The embodiments are not limited to a 6T SRAM bit-cell. Other number of transistors used to form an SRAM bit-cell may also be used with enhanced storage node capacitors or capacitance. A 6T SRAM bit-cell includes n-type access transistors (or pass-gates) N1 and N4 coupled to storage nodes S0 and S1 respectively at one end (i.e., source/drain regions) and BL and BL# (i.e., inverse of BL) respectively on the other end (i.e., drain/source regions). The gate terminals of N1 and N4 are controlled by WL. Here, $C_{BL}$ is the parasitic capacitance of the BL.

The storage nodes S0 and S1 are coupled to back-to-back (or cross-coupled) inverters having pull-up p-type devices P1 and P2, and pull-down n-type devices N2 and N3. The source terminals of P1 and P2 are coupled to power supply Vcc (also referred here as the first power supply node). The source terminals of N2 and N3 are coupled to ground Vss (also referred here as the second power supply node). The drain terminal of N2 is coupled to drain terminal of P1 and gate terminals of P2 and N3. The drain terminal of N3 is coupled to drain terminal of P2 and gate terminals of P1 and N2. Here, the two source node coupling capacitors are shown as Cm. In the embodiments, this coupling capacitance Cm is increased to improve read noise margin and overall performance of the SRAM bit-cell. Here, parasitic capacitors $C_{SN}$ are on the storage nodes S0 and S1.

In one embodiment, the coupling capacitance ($C_m$) between the two storage nodes, S0 and S1, is dominated by the diffusion contact to gate capacitance ($C_{CTG}$). $C_{CTG}$ is typically minimized with Low-K spacer to meet the performance requirement of logic transistor. In one embodiment, a higher $C_{CTG}$ between the storage nodes S0 and S1 of SRAM bit-cell 100 reduces the read disturb noise during read operation and improves read noise margin. Read noise margin determines SRAM Vmin, where Vmin is the minimum operating supply voltage Vcc at which SRAM bit-cell 100 retains its data (i.e., continues to functionally operate).

During read operation, charge stored in the BL capacitance ($C_{BL}$) is transferred to storage node S0 through pass gate transistor N1, causing a transient voltage bump at storage node S0. The same voltage bump is also observed on node S1 via pass gate N4. If the voltage bump exceeds the threshold voltage of pull-down transistor N3, state of SRAM bit-cell 100 flips, resulting in a read failure. In one embodiment, with higher $C_{CTG}$ and Cm, voltage bump at storage nodes S0 and S1 is greatly suppressed, resulting in a higher read noise margin and lower SRAM Vmin.

Figure 2:
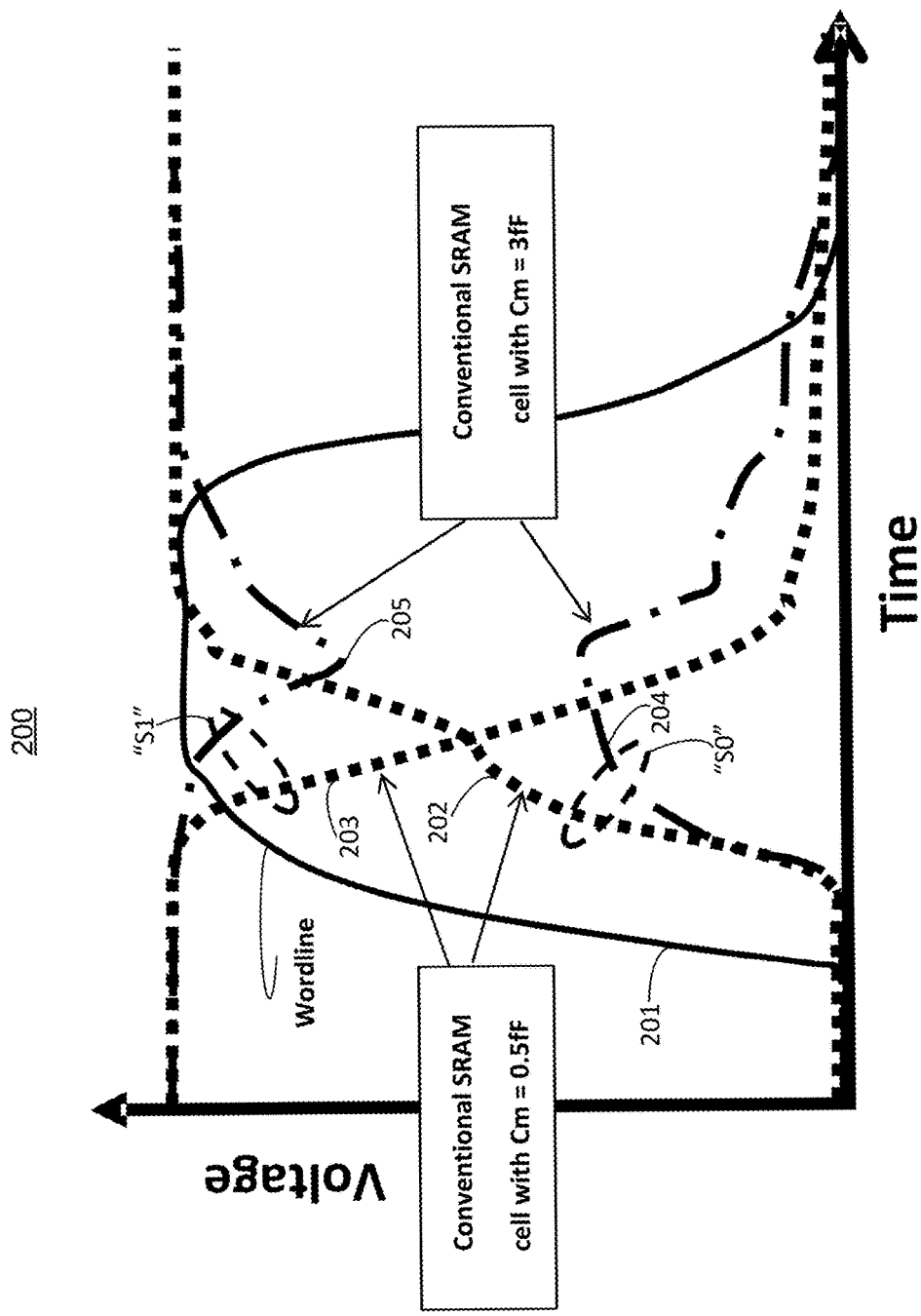
FIG. 2 illustrates a plot showing storage node voltage waveforms for different coupling capacitances, according to one embodiment of the disclosure.

FIG. 2 illustrates a plot 200 showing storage node voltage waveforms for different coupling capacitances. It is pointed out that those elements of FIG. 2 having the same reference numbers (or names) as the elements of any other figure can operate or function in any manner similar to that described, but are not limited to such.

Here, x-axis is time and y-axis is voltage. Plot 200 shows five waveforms 201, 202, 203, 204, and 205. Waveform 201 is WL. When WL transitions from low to high, SRAM bit-cell 100 is in read mode, and when WL transitions from high to low, SRAM bit-cell 100 is no longer in read mode. Waveforms 202 and 203 are voltages on node S0 when, for example, Cm=0.5 fF and Cm=3 fF, respectively (i.e., waveforms 202 and 203 illustrates the impact of increasing Cm). Waveforms 204 and 205 are voltages on node S1 when, for example, Cm=0.5 fF and Cm=3 fF, respectively (i.e., waveforms 204 and 205 illustrates the impact of increasing Cm). The values of Cm being 0.5 fF and 3 fF are described for illustration purposes. Other values of Cm may be used to illustrate the impact of increasing or decreasing Cm on read noise margin of bit-cell 100.

Continuing with the example, when Cm=0.5 fF, bit-cell 100 fails to retain data on its storage nodes S0 and S1 after the read operation. In one embodiment, voltage bumps on nodes S0 and S1 (i.e., waveforms 204 and 205) are greatly suppressed when Cm increases (e.g., from 0.5 fF to 3 fF). In one embodiment, the minimum Cm to lower the voltage bump before the read noise margin is proportional to $C_{BL}$.

Figure 3B:
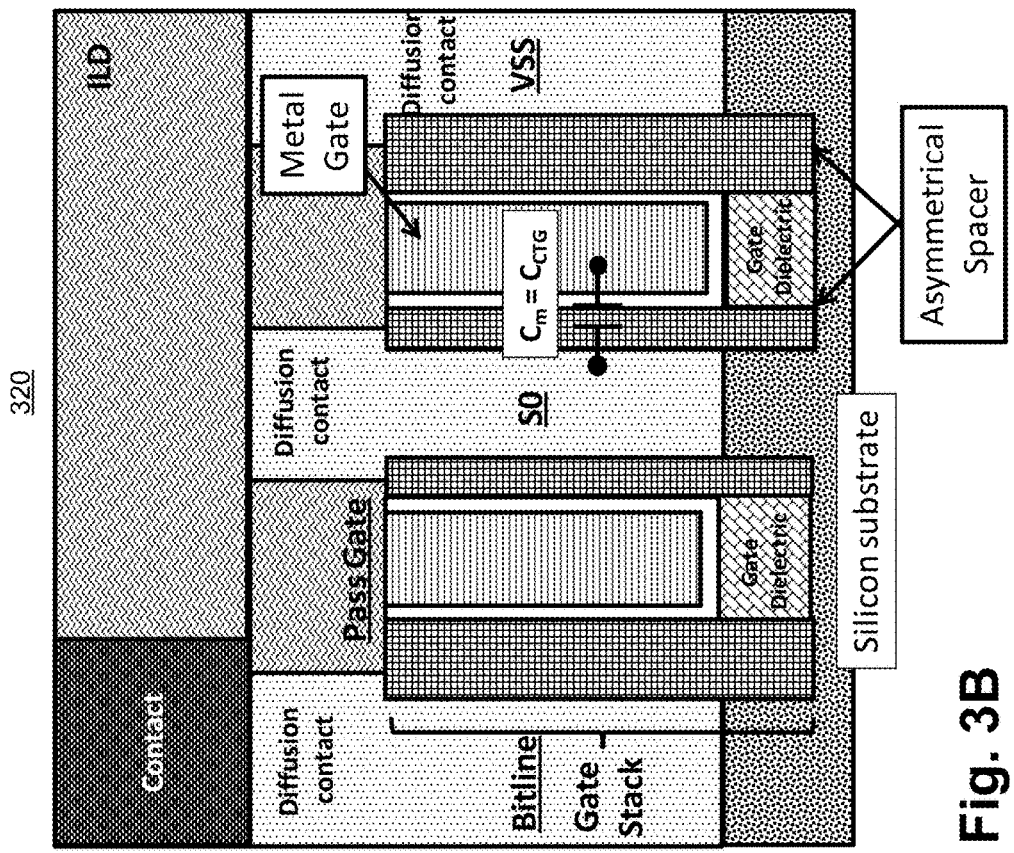
FIG. 3B illustrates a cross-section view of the SRAM bit-cell of FIG. 3A, according to one embodiment of the disclosure.
Figure 3A:
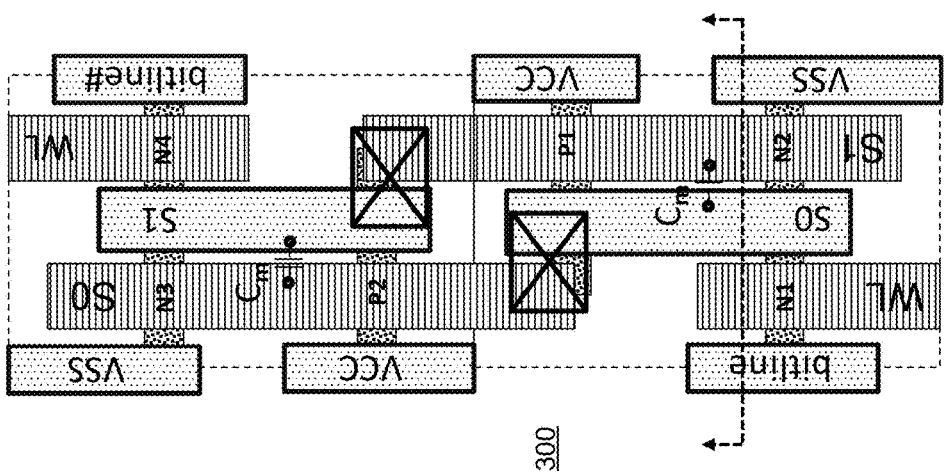
FIG. 3A illustrates an SRAM bit-cell layout with enhanced coupling capacitance between storage nodes, according to one embodiment of the disclosure.

FIG. 3A illustrates an SRAM bit-cell layout 300 with enhanced coupling capacitance between storage nodes, according to one embodiment of the disclosure. It is pointed out that those elements of FIG. 3A having the same reference numbers (or names) as the elements of any other figure can operate or function in any manner similar to that described, but are not limited to such.

Here, patterns/shades for the same layers or materials are shown with the same pattern/shades. For example, gate regions for N2, P1, P2, N3, N4, and N1 are shown as one type of pattern, while diffusion areas for bit-line, Vcc, Vss, S0, S1, and bit-line# are shown with another type of pattern. The rectangles in layout 300 with the cross in them illustrate contacts. The coupling capacitance between diffusion area of S0 and gate terminal of N2 (and P1) which is also labeled as S1, is Cm. Likewise, coupling capacitance between diffusion area of S1 and gate terminal of N3 (and P2) which is also labeled as S0, is Cm.

The spacing between diffusion area S0 and gate area S1 is referred as the "spacer." In one embodiment, the spacer between diffusion area S0 and gate area S1 is smaller than the spacer between gate area S1 and diffusion area Vss. Such spacers are referred here as asymmetric spacing or spacers. When spacers i.e., region between gate terminal and diffusion region is of the same (in dimensions) then the spacers are referred here as symmetric spacing or spacers. In one embodiment, asymmetric spacer between S1 gate region and S0 diffusion region increase Cm between S1 and S0. In one embodiment, asymmetric spacer between S0 gate region and S1 diffusion region increases Cm between S0 and S1.

In one embodiment, Cm is increased using symmetric spacers such that the spacer between S1 gate region and S0 diffusion region, and spacer between S0 gate region and S1 diffusion region, is formed using High-K material relative to other spacers in bit-cell 100. In one embodiment, Cm is increased using High-K material spacers for spacer between S1 gate region and S0 diffusion region, and spacer between S0 gate region and S1 diffusion region. In such an embodiment, asymmetric spacers are also used between S1 gate region and S0 diffusion region, and between S0 gate region and S1 diffusion region to increase Cm between S1 and S0.

FIG. 3B illustrates a cross-section view 320 of the SRAM bit-cell of FIG. 3A, according to one embodiment of the disclosure. It is pointed out that those elements of FIG. 3B having the same reference numbers (or names) as the elements of any other figure can operate or function in any manner similar to that described, but are not limited to such.

Here, the cross-section view 320 corresponds to the dotted arrow region of layout 300 (i.e., diffusion area of bit-line, WL (gate region of pass gate N1), diffusion region S0, S1 (gate region of pull-down N2), and diffusion area of Vss). The gate stack includes: a silicon substrate; gate dielectric layer; metal gate region; spacers on either side of the gate region; and ILD (inter-layer dielectric) layer on top of the gate region.

In this embodiment, asymmetrical spacers are shown on either sides of gate regions of pull-down N2 and pass gate N1. The smaller spacer between gate region of N2 and diffusion contact (or region) S0 increases coupling capacitance Cm between storage nodes S0 and S1. The wider spacer between gate region of pass gate N1 and bit-line diffusion contact (or region) reduces $C_{BL}$.

FIG. 4A illustrates an SRAM bit-cell layout 400 with enhanced coupling capacitance including an embedded MIM (Metal-Insulator-Metal) capacitor between storage nodes, according to one embodiment of the disclosure. It is pointed out that those elements of FIG. 4A having the same reference numbers (or names) as the elements of any other figure can operate or function in any manner similar to that described, but are not limited to such. FIG. 4A is described with reference to FIG. 3A. So as not to obscure the embodiment of FIG. 4A, differences between FIG. 4A and FIG. 3A are discussed.

Compared to the embodiment of FIG. 3A, in layout 400, a MIM capacitor is embedded or trenched in the gate regions of N2 and N3. In one embodiment, the other four transistors (N1, P1, P2, and N4) in SRAM bit-cell use regular gate stack. In one embodiment, High-K dielectric for MIM capacitor is deposited on top of the metal gate that serves as the gate of pull-down transistor and the bottom electrode of MIM capacitor. In one embodiment, the top electrode of the MIM capacitor is connected to the diffusion contact through a contact layer.

In one embodiment, adding the MIM capacitor increases $C_m$ ($C_m = C_{MIM} + C_{CTG}$) to a desired value. In one embodiment, the dimension of MIM capacitor is optimized to provide the desired fF (femto Farad) of capacitance. In one embodiment, capacitance Cm can be further increased by using asymmetric spacer. In one embodiment, capacitance Cm can be further increased by using symmetric spacer formed from High-K material. In one embodiment, capacitance Cm can be further increased by using asymmetric spacer with higher-K material for the spacer (i.e., higher-K material for the spacer further increases capacitance Cm compared to regular lower-K material used for forming the spacer).

In one embodiment, thinner dielectric on the storage nodes and lower K and thicker dielectric on the BL node are used to increase the capacitance $C_{CTG}$ between storage nodes S0 and S1 and to lower bit-line capacitance ($C_{BL}$), respectively. An SRAM cell with higher $C_m/C_{BL}$ capacitance ratio have lower voltage bump which improves read noise margin. The embodiments improve read margin and read Vmin without applying conventional read assist circuit technique where the under driven WL degrades read performance and increases power.

FIG. 4B illustrates a cross-section view 420 of the SRAM bit-cell of FIG. 4A, according to one embodiment of the disclosure. It is pointed out that those elements of FIG. 4B having the same reference numbers (or names) as the elements of any other figure can operate or function in any manner similar to that described, but are not limited to such. FIG. 4B is described with reference to FIG. 3B. So as not to obscure the embodiment of FIG. 4B, differences between FIG. 4B and FIG. 3B are discussed.

In this embodiment, a trench MIM capacitor is formed in the gate of transistor N2 by etching the metal from the gate region, depositing a layer of High-K material inside the trench, and the topping off the trench with metal to form an electrode. In one embodiment, the top electrode of the MIM capacitor is connected to the diffusion contact through a contact layer. In one embodiment, the High-K dielectric of MIM capacitor, which is deposited on top of the metal gate, serves as the gate of pull-down transistor N2 and the bottom electrode of the MIM capacitor.

FIG. 5A illustrates an SRAM bit-cell layout 500 with enhanced coupling capacitance including a grown or stacked MIM capacitor between storage nodes, according to one embodiment of the disclosure. It is pointed out that those elements of FIG. 5A having the same reference numbers (or names) as the elements of any other figure can operate or function in any manner similar to that described, but are not limited to such.

FIG. 5A is described with reference to FIG. 4A. Layout 500 is similar to layout 400 except that the MIM capacitor is a stacked capacitor instead of trench MIM capacitor. In this embodiment, instead of etching a trench in the gate metal region for pull-down transistors N2 and N3, metal is grown forming a hump over the gate region of pull-down transistors N2 and N3. In one embodiment, a layer of High-K material is deposited over the gate hump and then metal is deposited over the layer of High-K material to form the top contact of the stacked MIM capacitor and diffusion contact. In one embodiment, the High-K dielectric of stacked MIM capacitor, which is deposited on top of the metal gate, serves as the gate of pull-down transistors and the bottom electrode of the stacked MIM capacitor.

FIG. 5B illustrates a cross-section view 520 of the SRAM bit-cell of FIG. 5A, according to one embodiment of the disclosure. It is pointed out that those elements of FIG. 5B having the same reference numbers (or names) as the elements of any other figure can operate or function in any manner similar to that described, but are not limited to such. FIG. 5B is described with reference to FIGS. 4B and 3B. So as not to obscure the embodiment of FIG. 5B, differences between FIG. 5B and FIG. 4B are discussed.

In this embodiment, a stacked MIM capacitor is formed on the gate of transistor N2 by growing metal on the gate region, depositing a layer of High-K material over the grown metal, and forming an electrode over the High-K material layer. In one embodiment, the top electrode of the MIM capacitor is connected to the diffusion contact through a contact layer. In one embodiment, the High-K dielectric of MIM capacitor which is deposited on top of the metal gate serves as the gate of pull-down transistor N2 and the bottom electrode of the stacked MIM capacitor. In one embodiment, the integrated capacitor (i.e., stacked MIM capacitor) can expand into interconnect layers above the gate region if a higher capacitance is needed.

Figure 6A:
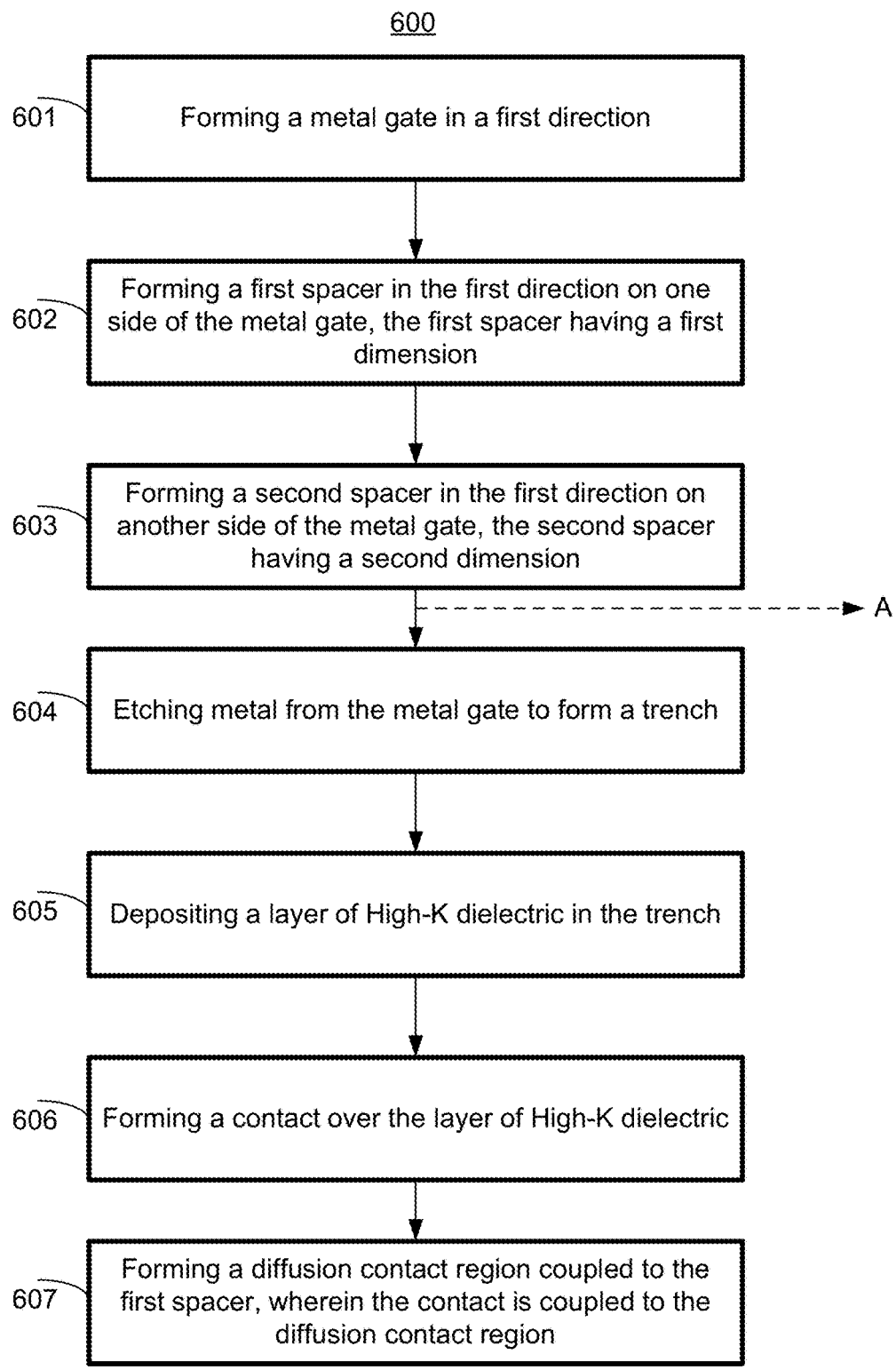
FIG. 6A illustrates a flowchart of a method for forming enhanced capacitance including trench MIM capacitor between storage nodes, according to one embodiment of the disclosure.

FIG. 6A illustrates a flowchart 600 of a method for forming enhanced capacitance including trench MIM capacitor between storage nodes, according to one embodiment of the disclosure. It is pointed out that those elements of FIG. 6 having the same reference numbers (or names) as the elements of any other figure can operate or function in any manner similar to that described, but are not limited to such.

Although the blocks in the flowcharts with reference to FIG. 6A are shown in a particular order, the order of the actions can be modified. Thus, the illustrated embodiments can be performed in a different order, and some actions/blocks may be performed in parallel. Some of the blocks and/or operations listed in FIG. 6A are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 601, metal gate is formed in a first direction. At block 602, a first spacer is formed in the first direction on one side of the metal gate, the first spacer having a first dimension. At block 603, a second spacer is formed in the first direction on another side of the metal gate, the second spacer having a second dimension. Here, the first dimension is substantially different than the second dimension to form asymmetric spacers. The process then proceeds to either 'A' of FIG. 6B or continues to block 604.

Referring back to FIG. 6A, at block 604, metal is etched from the metal gate to form a trench. At block 605, a layer of High-K dielectric material is formed in the trench. At block 606, a contact is formed over the layer of High-K dielectric material. At block 607, a diffusion contact region is formed where the diffusion contact region is coupled to the first spacer. In one embodiment, the contact is coupled to the diffusion contact region. Process 604-607 form the trench MIM capacitor.

Figure 6B:
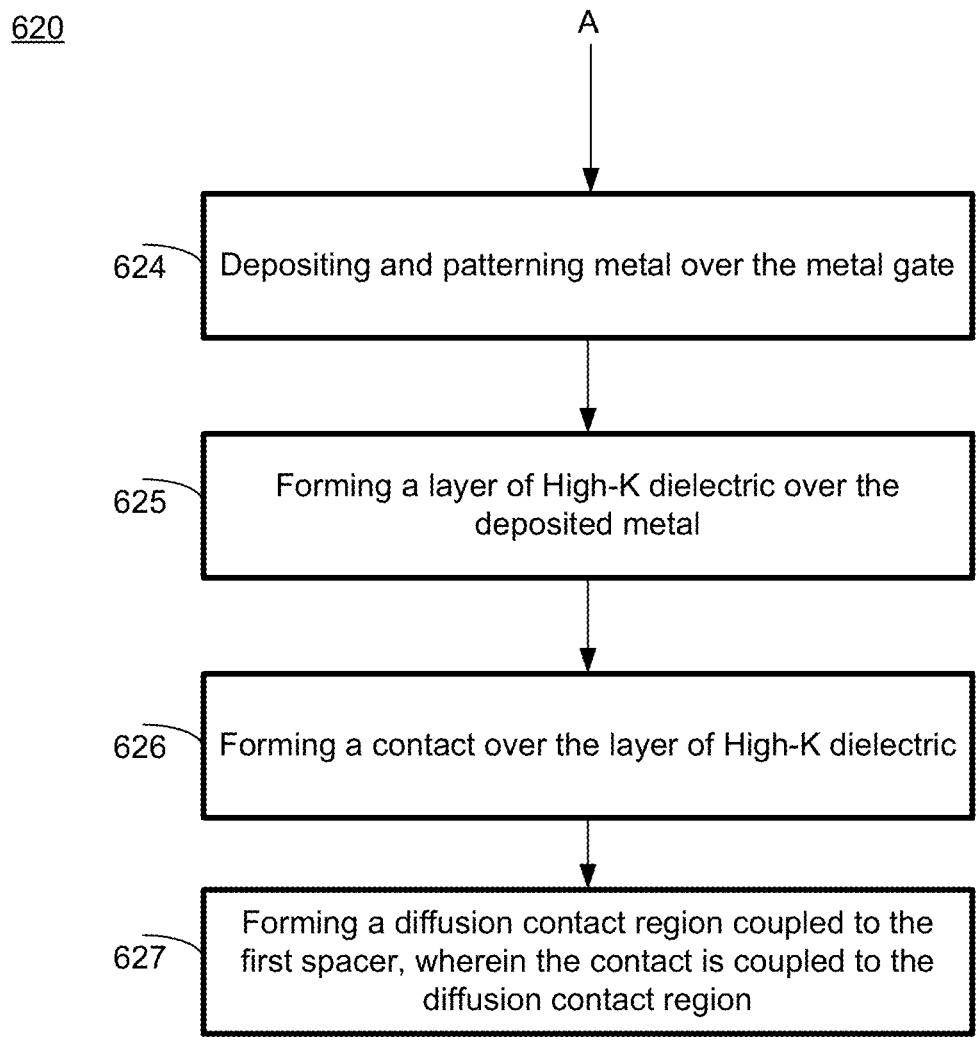
FIG. 6B illustrates a flowchart of a method for forming enhanced capacitance including stacked MIM capacitor between storage nodes, according to one embodiment of the disclosure.

FIG. 6B illustrates a flowchart 620 of a method for forming enhanced capacitance including stacked MIM capacitor between storage nodes, according to one embodiment of the disclosure. Although the blocks in the flowcharts with reference to FIG. 6B are shown in a particular order, the order of the actions can be modified. Thus, the illustrated embodiments can be performed in a different order, and some actions/blocks may be performed in parallel. Some of the blocks and/or operations listed in FIG. 6B are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 624, metal is deposited and patterned over the metal gate. At block 625, a layer of High-K dielectric material is formed over the deposited metal. At block 626, a contact over the layer of High-K dielectric material is formed. At block 627, a diffusion contact region coupled to the first spacer is formed. In one embodiment, the contact is coupled to the diffusion contact region. Process 624-627 form the stacked MIM capacitor.

Figure 7:
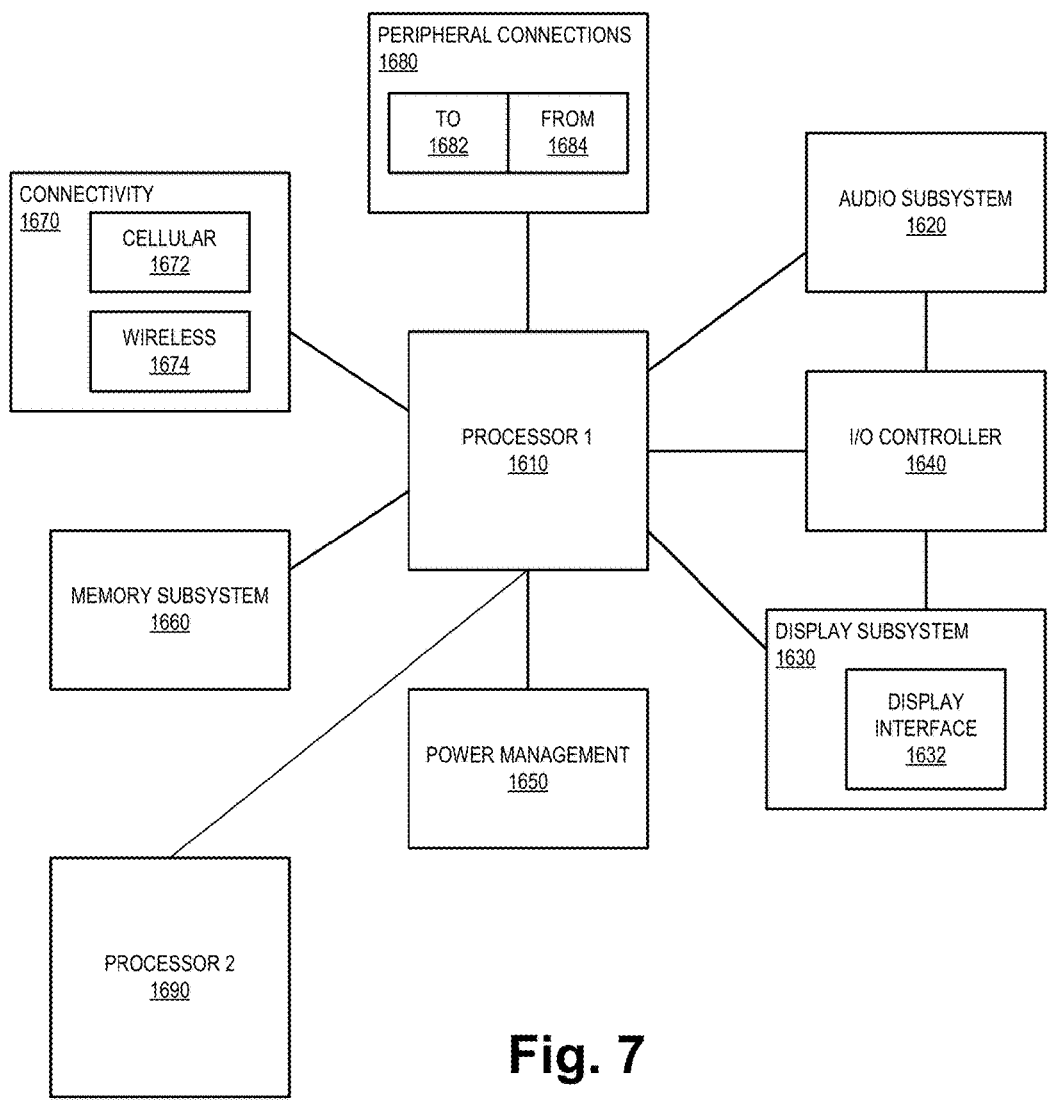
FIG. 7 illustrates a smart device or a computer system or an SoC (System-on-Chip) with SRAM having enhanced coupling capacitance between storage nodes, according to one embodiment of the disclosure.

FIG. 7 illustrates a smart device or a computer system or an SoC (System-on-Chip) with SRAM having enhanced coupling capacitance between storage nodes, according to one embodiment of the disclosure. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with SRAM having enhanced coupling capacitance between storage nodes according to the embodiments. In one embodiment, computing device 1600 includes a second processor 1690 with SRAM having enhanced coupling capacitance between storage nodes, according to the embodiments discussed herein. In one embodiment, second processor 1690 is optional. Other blocks of the computing device 1600 with I/O drivers may also include SRAM having enhanced coupling capacitance between storage nodes according to the embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an SRAM cell is provided which comprises: a first n-type transistor with a gate terminal coupled to word-line (WL), source/drain terminal coupled to a first bit-line (BL) and drain/source terminal coupled to a first node; and a second n-type transistor with a source terminal coupled to a first power supply node, a drain terminal coupled to the first node, and a gate terminal coupled to multiple terminals, wherein the gate terminal includes an integrated capacitor to increase coupling capacitance between the first and second nodes.

In one embodiment, the SRAM cell further comprises: a first p-type transistor with a source terminal coupled to a second power supply node and a drain terminal coupled to the first node, wherein the gate terminals of the first p-type transistor and the second n-type transistor are coupled to a second node; and a third n-type transistor with a source terminal coupled to the first power supply node, a drain terminal coupled to the second node, and a gate terminal for coupling to multiple terminals, wherein the gate terminal includes an integrated capacitor to increase coupling capacitance of the third n-type transistor.

In one embodiment, the SRAM cell further comprises: a second p-type transistor with a source terminal coupled to the second power supply node and a drain terminal coupled to the second node, wherein the gate terminals of the third n-type transistor and the second p-type transistor are coupled to the first node; and a fourth n-type transistor with a gate terminal coupled to WL, source/drain terminal coupled to a second BL, and drain/source terminal coupled to the second node. In one embodiment, the first and second BLs are formed from Low-K material while the first and second nodes are formed from High-K material. In one embodiment, the integrated capacitors of the gate terminals of the second n-type transistor and the third n-type transistor, respectively, are embedded in the gate regions of the second n-type transistor and the third n-type transistor, respectively.

In one embodiment, the integrated capacitors of the gate terminals of the second n-type transistor and the third n-type transistor, respectively, are formed above the gate regions of the second n-type transistor and the third n-type transistor, respectively. In one embodiment, the spacing on either side of the gate terminals of the first and second n-type transistors is asymmetric such that the spacing between the gate terminal of the first n-type transistor and a diffusion contact region associated with the first node is smaller than the spacing between the gate terminal of the first n-type transistor and a diffusion contact region associated with the first BL.

In one embodiment, the spacing on either side of the gate terminals of the first and second n-type transistors is symmetric such that the spacing between the gate terminal of the first n-type transistor and a diffusion contact region associated with the first node is substantially equal to the spacing between the gate terminal of the first n-type transistor and a diffusion contact region associated with the first BL. In one embodiment, the spacing between the gate terminal of the first n-type transistor and a diffusion contact region associated with the first node is formed of High-K material. In one embodiment, the spacing between the gate terminal of the first n-type transistor and a diffusion contact region associated with the first BL is formed of a Low-K material.

In another example, a method is provided which comprises: forming a metal gate in a first direction; forming a first spacer in the first direction on one side of the metal gate, the first spacer having a first dimension; and forming a second spacer in the first direction on another side of the metal gate, the second spacer having a second dimension, wherein the first dimension is substantially different from the second dimension. In one embodiment, the method further comprises: etching metal from the metal gate to form a trench; depositing a layer of High-K dielectric material in the trench; and forming a contact over the layer of High-K dielectric material.

In one embodiment, the method further comprises: forming a diffusion contact region coupled to the first spacer, wherein the contact is coupled to the diffusion contact region. In one embodiment, the diffusion contact region is associated with a storage node of an SRAM cell. In one embodiment, the method further comprises: depositing and patterning metal over the metal gate; depositing a layer of High-K dielectric material over the deposited metal; and forming a contact over the layer of High-K dielectric material. In one embodiment, the method further comprises forming a diffusion contact region coupled to the first spacer, wherein the contact is coupled to the diffusion contact region. In one embodiment, the diffusion contact region is associated with a storage node of an SRAM cell.

In another example, a system is provided which comprises: a memory unit; a processor coupled to the memory unit, the processor having an SRAM cell which includes: a first n-type transistor with a gate terminal coupled to word-line (WL), source/drain terminal coupled to a first bit-line (BL) and drain/source terminal coupled to a first node; and a second n-type transistor with a source terminal coupled to a first power supply node, a drain terminal coupled to the first node, and a gate terminal for coupling to multiple terminals, wherein the gate terminal includes an integrated capacitor to increase coupling capacitance associated with the first node; and a wireless interface for coupling the processor to another device. In one embodiment, the first BL is formed from Low-K material while the first node is formed from a High-K material. In one embodiment, the integrated capacitor of the gate terminal of the second n-type transistor is either embedded in the gate region of the second n-type transistor or is formed above the gate region of the second n-type transistor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An SRAM cell comprising:
   a first n-type transistor with a gate terminal coupled to word-line (WL), a source/drain terminal coupled to a first bit-line (BL) and a drain/source terminal coupled to a first node; and,
   a second n-type transistor with a source terminal coupled to a reference node, a drain terminal coupled to the first node, and a gate terminal coupled to a second node, wherein the gate terminal includes an integrated capacitor to increase coupling capacitance between the first and second nodes, the integrated capacitor comprising a bottom electrode formed with a same conductive layer used to form the gate terminal of the second n-type transistor, the integrated capacitor having a length that does not extend beyond a single gate length, wherein a spacing on either side of the gate terminals of the first and second n-type transistors is asymmetric such that a spacing between the gate terminal of the first n-type transistor and a diffusion contact region associated with the first node is smaller than a spacing between the gate terminal of the first n-type transistor and a diffusion contact region associated with the first BL.

2. The SRAM cell of claim 1 further comprises:
   a first p-type transistor with a source terminal coupled to a power supply node and a drain terminal coupled to the first node, wherein the gate terminals of the first p-type transistor and the second n-type transistor are coupled to a second node; and
   a third n-type transistor with a source terminal coupled to the reference node, a drain terminal coupled to the second node, and a gate terminal coupled to the first node, wherein the gate terminal of the third n-type transistor includes a second integrated capacitor to increase coupling capacitance between the first and the second nodes.

3. The SRAM cell of claim 2 further comprises:
   a second p-type transistor with a source terminal coupled to the power supply node and a drain terminal coupled to the second node, wherein the gate terminals of the third n-type transistor and the second p-type transistor are coupled to the first node; and
   a fourth n-type transistor with a gate terminal coupled to the WL, a source/drain terminal coupled to a second BL, and a drain/source terminal coupled to the second node.

4. The SRAM cell of claim 1, wherein the spacing between the gate terminal of the first n-type transistor and the diffusion contact region associated with the first node is formed of High-K dielectric material.

5. The SRAM cell of claim 1, wherein the spacing between the gate terminal of the first n-type transistor and the diffusion contact region associated with the first BL is formed of a Low-K dielectric material.

6. A system comprising:
   a memory unit;
   a processor coupled to the memory unit, the processor having an SRAM cell which includes:
   a first n-type transistor with a gate terminal coupled to word-line (WL), a source/drain terminal coupled to a first bit-line (BL) and a drain/source terminal coupled to a first node; and,
   a second n-type transistor with a source terminal coupled to a reference node, a drain terminal coupled to the first node, and a gate terminal coupled to a second node, wherein the gate terminal includes an integrated capacitor to increase coupling capacitance between the first and second nodes, the integrated capacitor comprising a bottom electrode formed with a same conductive layer used to form the gate terminal of the second n-type transistor, the integrated capacitor having a length that does not extend beyond a single gate length, wherein a spacing on either side of the gate terminals of the first and second n-type transistors is asymmetric such that a spacing between the gate terminal of the first n-type transistor and a diffusion contact region associated with the first node is smaller than a spacing between the gate terminal of the first n-type transistor and a diffusion contact region associated with the first BL; and
   a wireless interface for coupling the processor to another device.

7. The system of claim 6, wherein the layer of conductive material serves as a bottom electrode of the integrated capacitor.

* * * * *